United States Patent
Chiu et al.

(10) Patent No.: US 10,249,971 B2
(45) Date of Patent: Apr. 2, 2019

(54) CIRCUIT BOARD WITH WIRE CONDUCTIVE PADS AND METHOD FOR FIXING THE WIRE CONDUCTIVE PADS TO THE CIRCUIT BOARD

(71) Applicants: Kao-Kung Chiu, New Taipei (TW); Shin-Nung Cheng, New Taipei (TW)

(72) Inventors: Kao-Kung Chiu, New Taipei (TW); Shin-Nung Cheng, New Taipei (TW)

( * ) Notice: Subject to any disclaimer, the term of this patent is extended or adjusted under 35 U.S.C. 154(b) by 0 days.

(21) Appl. No.: 15/697,429

(22) Filed: Sep. 6, 2017

(65) Prior Publication Data
US 2018/0076550 A1     Mar. 15, 2018

(30) Foreign Application Priority Data
Sep. 9, 2016   (TW) .............................. 105129221 A

(51) Int. Cl.
| | |
|---|---|
| *H01R 4/24* | (2018.01) |
| *H01R 12/72* | (2011.01) |
| *H01R 12/75* | (2011.01) |
| *H05K 1/11* | (2006.01) |
| *H05K 1/18* | (2006.01) |
| *H05K 3/22* | (2006.01) |
| *H05K 7/06* | (2006.01) |
| *H05K 3/32* | (2006.01) |
| *H05K 3/34* | (2006.01) |

(52) U.S. Cl.
CPC ........... *H01R 12/728* (2013.01); *H01R 12/75* (2013.01); *H05K 1/117* (2013.01); *H05K 1/181* (2013.01); *H05K 3/222* (2013.01); *H05K 3/32* (2013.01); *H05K 7/06* (2013.01); *H05K 3/3405* (2013.01); *H05K 2201/1031* (2013.01); *H05K 2201/1034* (2013.01); *H05K 2201/10287* (2013.01); *H05K 2201/10356* (2013.01); *H05K 2201/10446* (2013.01); *H05K 2201/10962* (2013.01); *Y02P 70/611* (2015.11)

(58) Field of Classification Search
CPC .................................................. H01R 4/4818
USPC ....................................... 439/441, 852, 853
See application file for complete search history.

(56) References Cited

U.S. PATENT DOCUMENTS

| | | | | |
|---|---|---|---|---|
| 4,299,436 A | * | 11/1981 | Ackerman | H01R 12/55 439/853 |
| 6,475,040 B1 | * | 11/2002 | Myer | H01R 13/11 439/374 |
| 7,306,477 B1 | * | 12/2007 | Huang | H01R 4/4818 439/353 |

* cited by examiner

*Primary Examiner* — Phuong K Dinh
(74) *Attorney, Agent, or Firm* — Bruce Stone LLP; Joseph Bruce

(57) ABSTRACT

A circuit board with wire conductive pads is provided for insertion of wires, and includes: a circuit board and a wire conductive pad. The wire conductive pad includes a main body in the form of a hollow column and an elastic locking piece extending from the main body. The main body includes a peripheral wall defining an insertion space. The elastic locking piece is inserted from the peripheral wall into the insertion space in an inclined manner to press towards the peripheral wall. Wires are inserted into the insertion space and clamped against the peripheral wall by the elastic piece, so that the wires can be prevented from falling off in a reverse direction, and thus can be connected to the circuit board in a more quick and stable manner.

2 Claims, 7 Drawing Sheets

CIRCUIT BOARD WITH WIRE CONDUCTIVE PADS AND METHOD FOR FIXING THE WIRE CONDUCTIVE PADS TO THE CIRCUIT BOARD

BACKGROUND

Field of the Invention

The present invention relates to circuit board peripheral fittings, and more particularly to a circuit board with wire conductive pads, and a method for fixing the wire conductive pads to the circuit board.

Related Prior Art

Circuit boards are one of indispensible components to various electronic equipments. When the electronic equipments are different, the configuration and the wiring of the circuit boards therein are also different. Each type of the circuit boards needs to be connected with an input power wire and an output power wire which are usually welded to the circuit boards. Welding process always requires a lot of manual operation. The solder joints of the circuit boards are large in quantity but micro in size, therefore, workers have to spend a lot of time on welding, and improper welding may cause short circuit between the solder joints or fall off of the wires, etc., resulting in unnecessary danger and harm. Hence, there is an urgent need to find a wire conductive pad capable of quickly fixing wires to the circuit board.

SUMMARY

One objective of the present invention is to provide a circuit board with wire conductive pads capable of quickly fixing wires to the circuit boards.

Another objective of the present invention is to provide a circuit board with wire conductive pads capable of fixing wires to the circuit board in a more stable and reliable manner, so as to improve the wiring safety.

Yet, another objective of the present invention is to provide a method for fixing the wire conductive pads to the circuit board.

To achieve the above objective, a circuit board with wire conductive pads being provided for insertion of a wire, and comprises:

a circuit board including at least one contact point; and each of the wire conductive pads including a main body and an elastic locking piece;

wherein the main body is in the form of a hollow column made of conductive material, disposed at the contact point of the circuit board, and includes a peripheral wall defining an insertion space, the peripheral wall including an outer surface, an opposite inner surface and two lateral surfaces connected between two ends of the outer surface and the inner surface; and the elastic locking piece is formed on the peripheral wall and inserted into the insertion space in an inclined manner, so as to press the wire against the peripheral wall when the wire is inserted in the insertion space.

To achieve the above objective, a method for fixing the wire conductive pads to a plurality of circuit boards, comprises the following steps:

a step of preparing a stencil includes preparing the stencil, and applying solder paste on the stencil at positions corresponding to contact points of each of the plurality of circuit boards;

a step of applying solder paste includes applying the solder paste to the contact points of the circuit boards by pressing the stencil on the plurality of circuit boards;

a step of placing the wire conductive pads includes placing the wire conductive pads at the contact points of the circuit boards, and adhering, by the solder paste, the wire conductive pads to the contact points of the circuit boards; and a step of heating includes heating the circuit boards, so that the solder paste is melted to fix the wire conductive pads to the contact points.

The wire is tightly pressed against the inner surface of the peripheral wall by the elastic locking piece, so that the wire can be prevented from falling off in a reverse direction once it is inserted into the insertion space, and thus achieving a quick and reliable connection between the wire and the circuit board.

Furthermore, the volume of each of the wire conductive pads matches the size of each of the contact points of the circuit board, and the contact points are spaced from one another by a certain distance, so that the wire conductive pads can be prevented from coining into contact with one another, and therefore, there won't be short circuit between the wire conductive pads, so as to improve the safety.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there are illustrated preferred embodiments of the invention.

DETAILED DESCRIPTION

Figure 1:
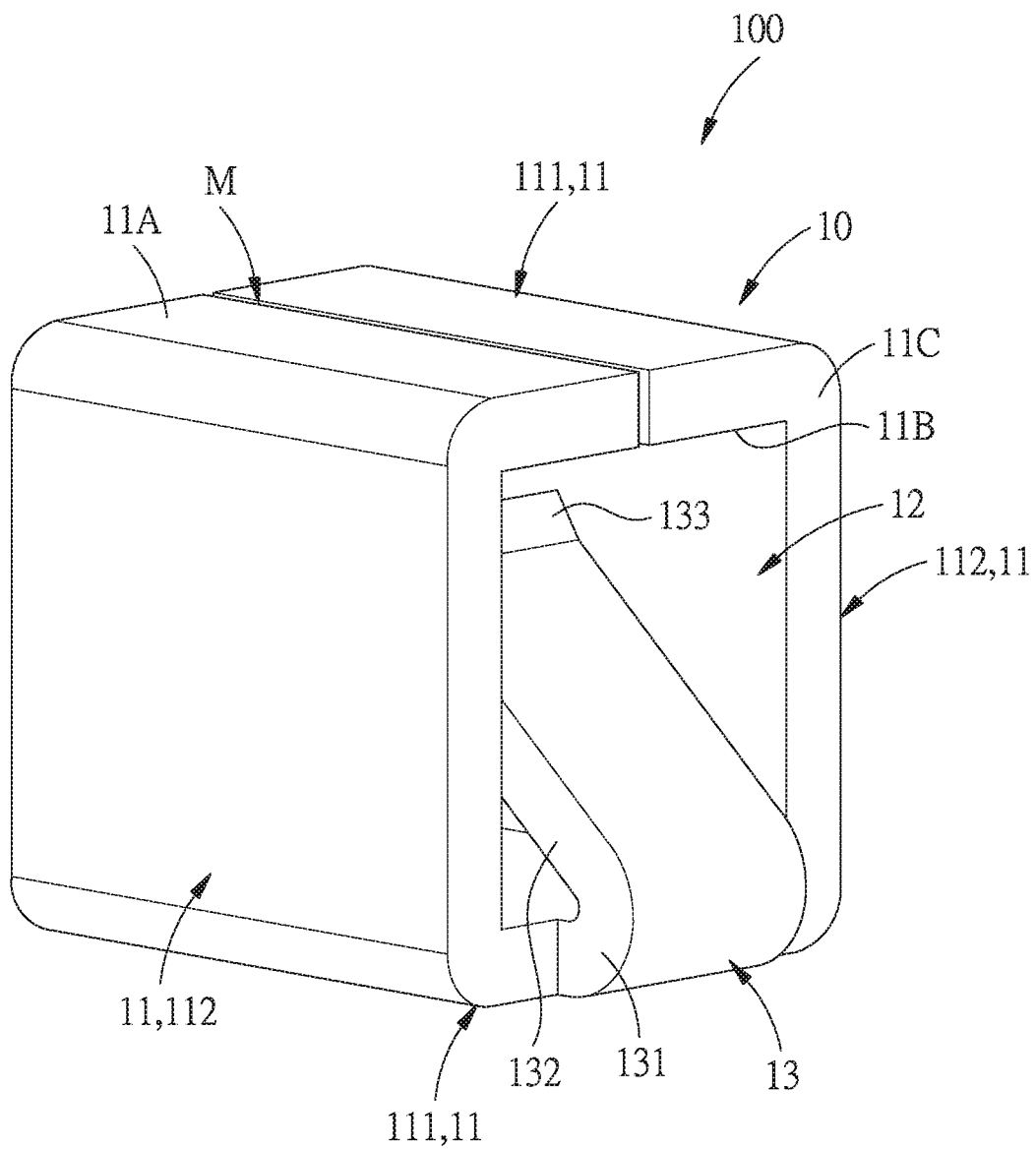
FIG. 1 is a perspective view of a wire conductive pad for a circuit board in accordance with a preferred embodiment of the invention.
Figure 2:
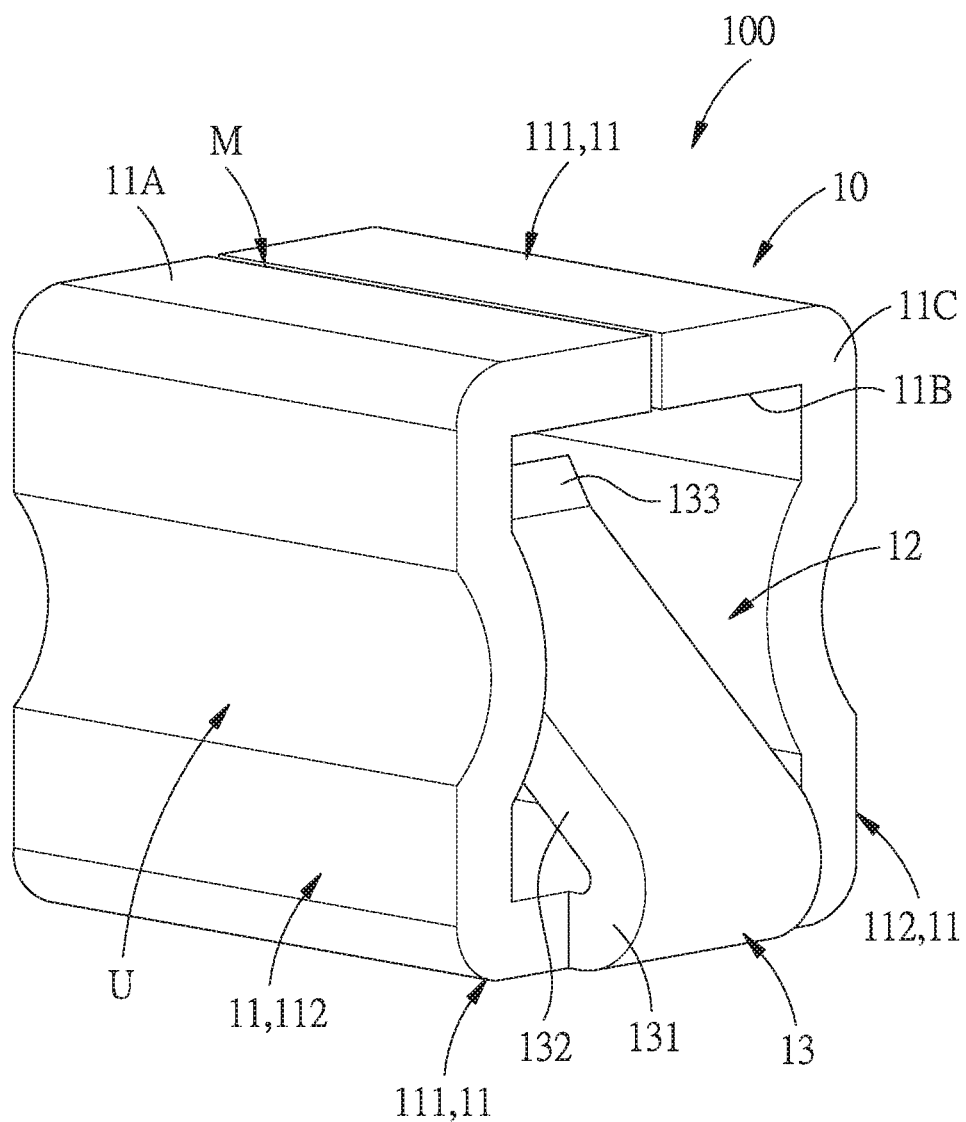
FIG. 2 is a perspective view of a wire conductive pad for a circuit board in accordance with another preferred embodiment of the invention.
Figure 3:
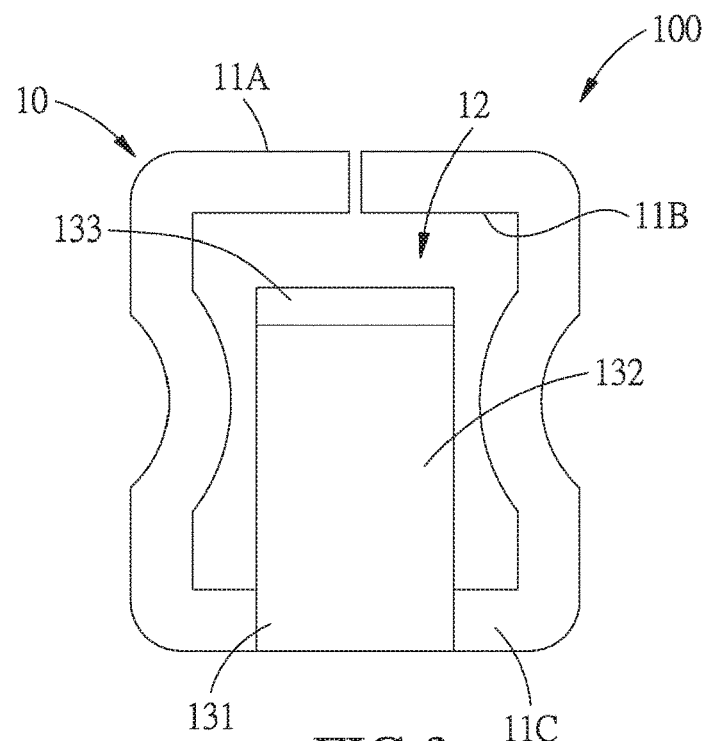
FIG. 3 is a front view of the wire conductive pad for a circuit board in accordance with the preferred embodiment of the invention.
Figure 4:
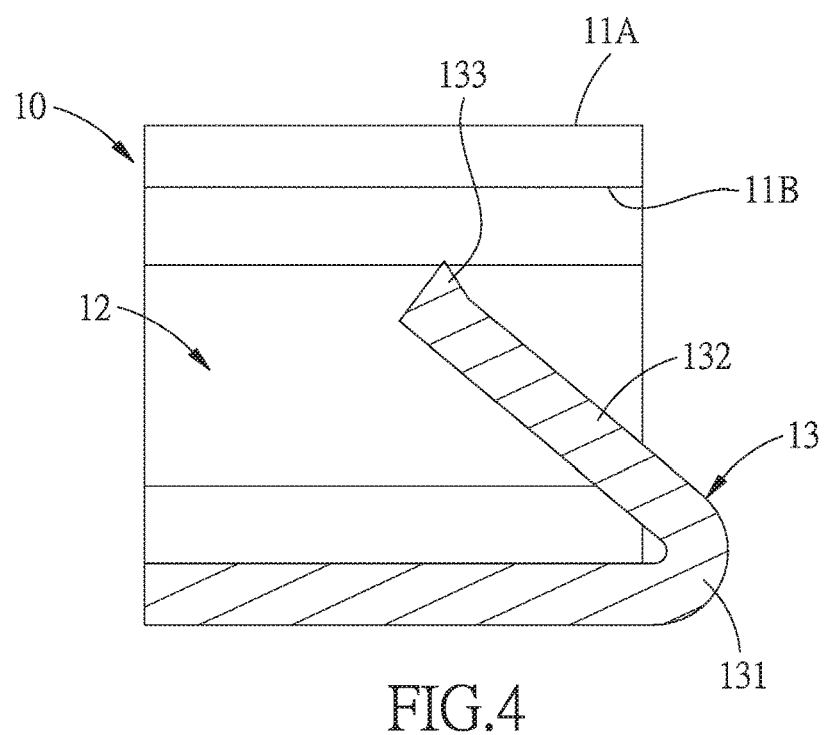
FIG. 4 is a cross sectional view of the wire conductive pad for a circuit board in accordance with the preferred embodiment of the invention.
Figure 5:
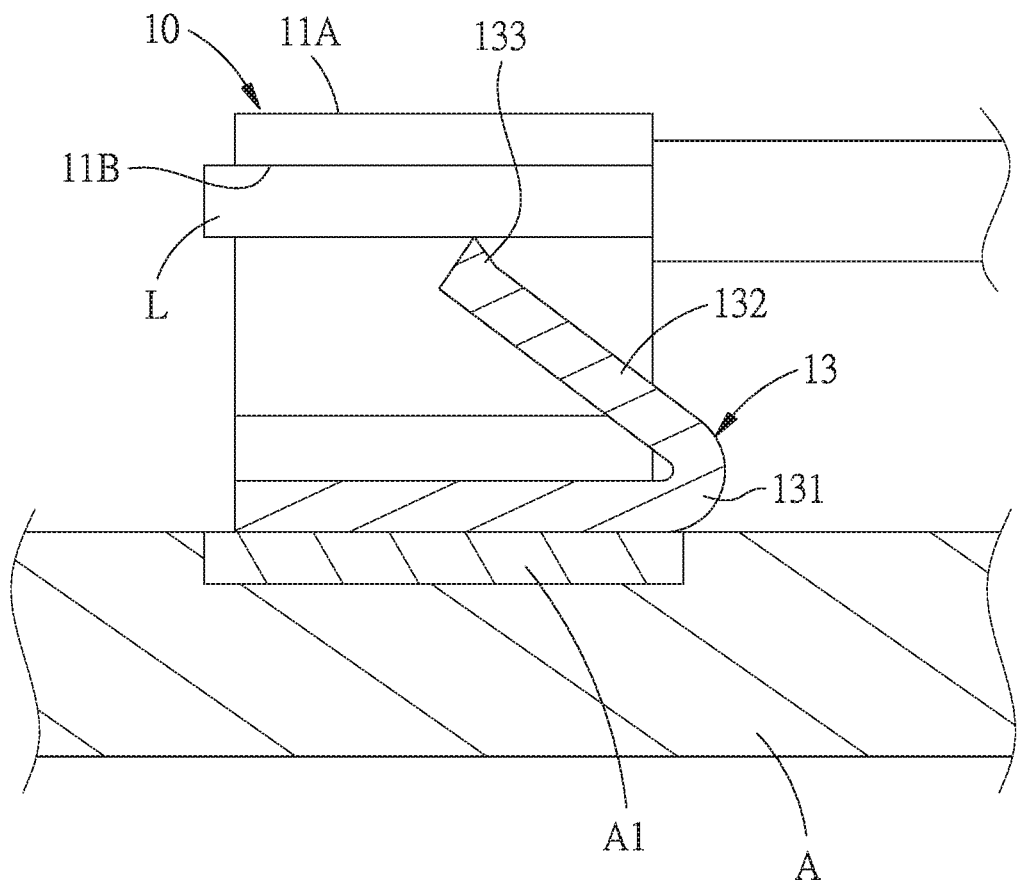
FIG. 5 is a cross sectional view showing that a wire is connected in the wire conductive pad of the invention.
Figure 6:
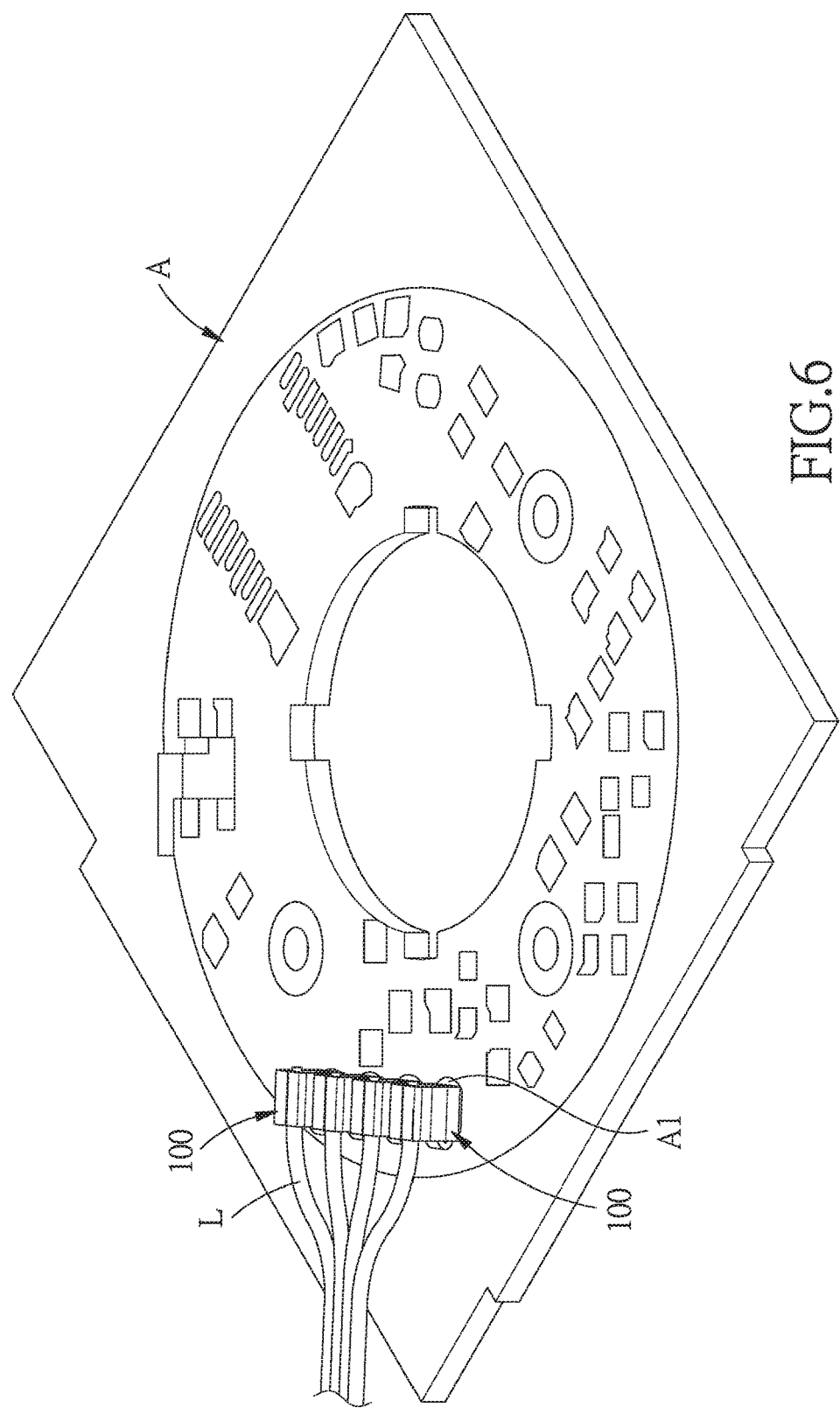
FIG. 6 is an illustrative view showing that the wire conductive pad of the invention is placed on the circuit board and connected with wires.

The present invention will be clearer from the following description when viewed together with the accompanying drawings, which show, for purpose of illustrations only, the preferred embodiment in accordance with the present invention.

Referring to FIGS. 1-6, a circuit board with wire conductive pads 100 in accordance with the preferred embodiment of the invention is provided for insertion of a wire L, and includes: a circuit board A and the wire conductive pads 100.

Each of the wire conductive pads includes a main body 10 and an elastic locking piece 13.

The circuit board A includes at least one contact point A1.

The main body 10 is a hollow column made of conductive material, disposed at the contact point A1 of the circuit board A, and includes a peripheral wall 11 which defines an insertion space 12. The peripheral wall 11 includes an outer surface 11A, an opposite inner surface 11B and two lateral surfaces 11C connected between two ends of the outer surface 11A and the inner surface 11B. Each of the lateral surfaces 11C is perpendicular to the outer and inner surfaces 11A, 11B.

The elastic locking piece 13 is formed on one of the lateral surfaces 11C, made of conductive material, and is inserted into the insertion space 12. The elastic locking piece 13 has elasticity, which makes the elastic locking piece 13 keeps pressing in the direction of the inner surface 11B. The elastic locking piece 13 includes a force-accumulation section 131, a force-receiving section 132 and a pressing section 133. The force-accumulation section 131 is a reversely bent section, the force-receiving section 132 extends towards the insertion space 12 in an inclined manner, a turning angle of the force-receiving section 132 is different from that of the pressing section 133, and the pressing section 133 serves to press the wire L against the inner surface 11B of the peripheral wall 11.

In this embodiment, the main body 10 is a hollow column with a rectangular cross section. Suppose that the peripheral wall 11 includes two first lateral walls 111 and two second lateral walls 112. The two first lateral walls 111 are spaced from each other in a parallel manner, and the two second lateral walls 112 are spaced from each other in a parallel manner. The first lateral walls 111 are connected to the second lateral walls 112 in an alternative manner. The elastic locking piece 13 is formed on a lateral surface 11C of one of the first lateral walls 111, and another of the first lateral walls 111 is formed with a clearance M. Each of the second lateral walls 112 includes a groove U which enhances the structural strength of wire conductive pads 100.

Preferably, a plastic cap can be sleeved onto the main body 10, so as to prevent short circuit when two wire conductive pads 100 contact with each other.

What mentioned above are the structural relations of the main components of the circuit board with wire conductive pads, and the operation and function of the invention are explained in details as follows.

Referring to FIGS. 2-6, to connect the wire L to the circuit board with wire conductive pads of the invention, what the user has to do is to insert the metal portion of the wire L into the insertion space 12, so that the wire L is pressed by the pressing section 133 and clamped between the peripheral wall 11 and the elastic locking piece 13. Since the elastic locking piece 13 and the main body 10 are all made of conductive material, and the main body 10 is fixed at the contact point A1 of the circuit board A, the wire L can be electrically connected to the contact point A1 of the circuit board A via the wire conductive pads 100.

Besides, the wire L is tightly pressed against the inner surface 11B of the peripheral wall 11 by the elastic locking piece 13, so that the wire L can be prevented from falling off in a reverse direction once it is inserted into the insertion space 12, and thus achieving a quick and reliable connection between the wire L and the circuit board A.

Furthermore, the volume of each of the wire conductive pads 100 matches the size of each of the contact points A1 of the circuit board A, and the contact points A1 are spaced from one another by a certain distance, so that the wire conductive pads 100 can be prevented from coining into contact with one another, and therefore, there won't be short circuit between the wire conductive pads 100, so as to improve the safety.

Figure 7:
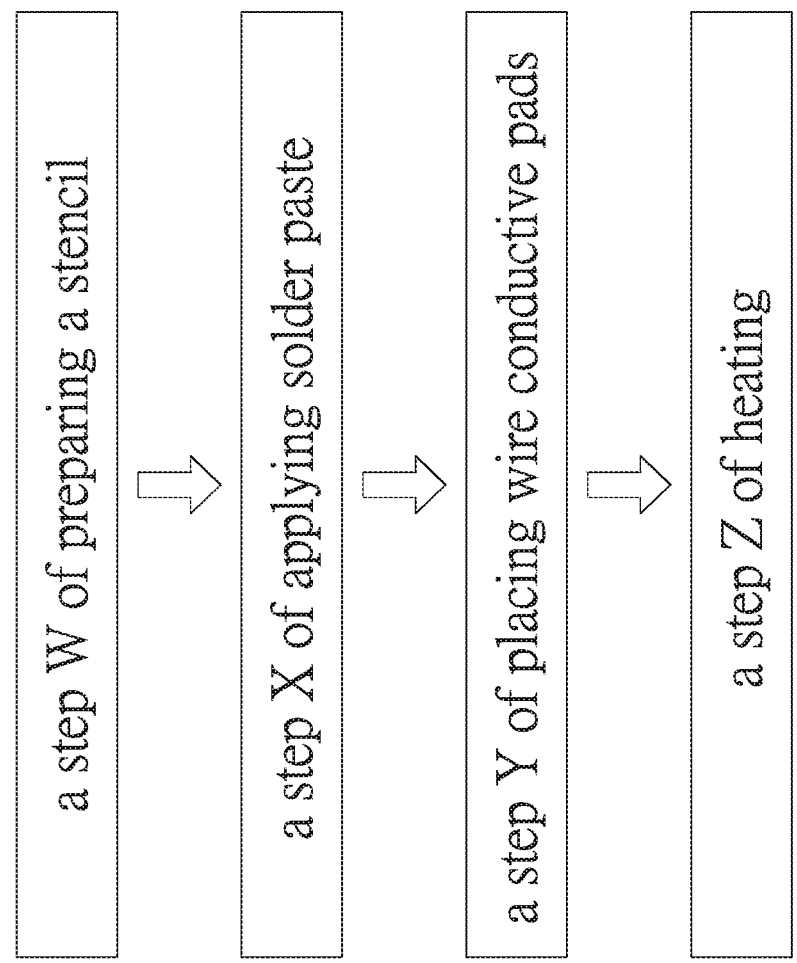
FIG. 7 is a flow chart of a method for fixing the wire conductive pads to circuit boards in accordance with the present invention.
Figure 8:
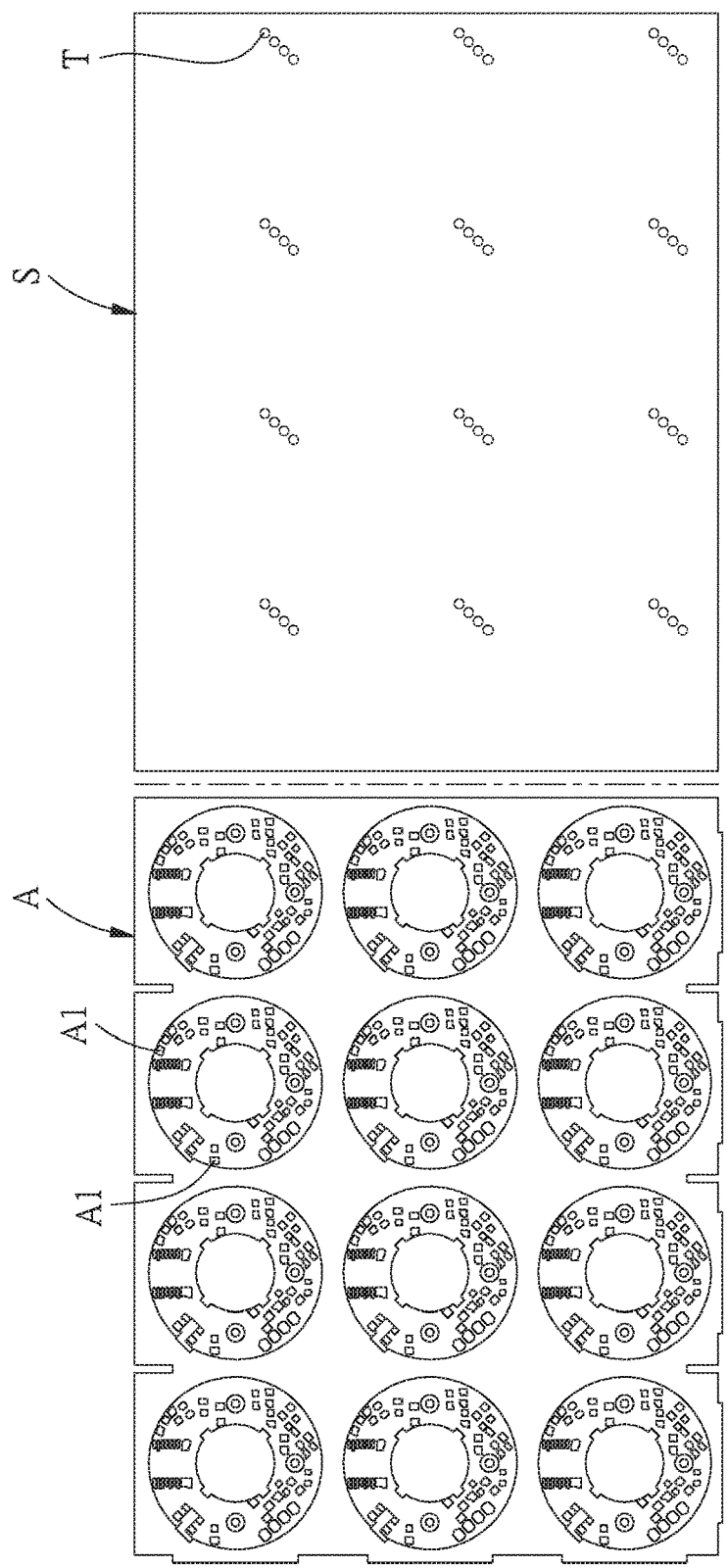
FIG. 8 is an illustrative view in accordance with the invention, showing how to fix the wire conductive pads to the circuit boards.

Referring to FIGS. 7 and 8, a method for fixing the wire conductive pads to circuit boards in accordance with the present invention comprises the following steps:

a step W of preparing a stencil includes preparing a stencil S, and applying solder paste T on the stencil S at positions corresponding to contact points A1 of each of a plurality of circuit boards A;

a step X of applying solder paste includes applying the solder paste T to the contact points A1 of the circuit boards A by pressing the stencil S on the plurality of circuit boards A;

a step Y of placing wire conductive pads 100 includes placing the wire conductive pads 100 at the contact points A1 of the circuit boards A, and adhering, by the solder paste T, the wire conductive pads 100 to the contact points A1 of the circuit boards A; and a step Z of heating includes heating the circuit boards A, so that the solder paste T is melted to fix the wire conductive pads 100 to the contact points A1.

Preferably, in the step Y of placing wire conductive pads 100, the circuit boards A are placed on a SMT (surface mount technology) machine, so that the wire conductive pads 100 are automatically attached to the contact points A1 of the circuit boards A by the SMT machine.

Preferably, in the step Z of heating, the circuit boards A pass through a soldering oven to melt the solder paste.

While we have shown and described various embodiments in accordance with the present invention, it is clear to those skilled in the art that further embodiments may be made without departing from the scope of the present invention.

What is claimed is:

1. A circuit board with wire conductive pads being provided for insertion of a wire, and comprising:
    a circuit board including at least one contact point;
    each of the wire conductive pads including a main body and an elastic locking piece;
    wherein the main body is in the form of a hollow column made of conductive material, disposed at the contact point of the circuit board, and includes a peripheral wall defining an insertion space, the peripheral wall includes an outer surface, an opposite inner surface and two lateral surfaces connected between two ends of the outer surface and the inner surface; and
    the elastic locking piece is formed on the peripheral wall and inserted into the insertion space in an inclined manner, so as to press the wire against the peripheral wall when the wire is inserted in the insertion space;
    the elastic locking piece includes a force-accumulation section, a force-receiving section and a pressing section, the force-accumulation section is a reversely bent section, the force-receiving section extends towards the insertion space in an inclined manner, a turning angle of the force-receiving section is different from that of the pressing section, and the pressing section serves to press the wire against the inner surface of the peripheral wall.

2. The circuit board with wire conductive pads as claimed in claim 1, wherein the main body has a rectangular cross section, the peripheral wall includes two first lateral walls and two second lateral walls, the two first lateral walls are spaced from each other in a parallel manner, the two second lateral walls are spaced from each other in a parallel manner, the first lateral walls are connected to the second lateral walls in an alternative manner, the elastic locking piece is formed on one of the lateral surfaces of one of the first lateral walls, and each of the second lateral walls includes a groove.

* * * * *